(12) United States Patent
Hoffman et al.

(10) Patent No.: US 11,482,577 B2
(45) Date of Patent: Oct. 25, 2022

(54) DISPLAY STRUCTURE FOR SMOOTH TRANSITION BETWEEN DIFFERENT PIXEL DENSITY REGIONS IN AN OLED DISPLAY

(71) Applicant: Google LLC, Mountain View, CA (US)

(72) Inventors: David Morris Hoffman, Fremont, CA (US); Sangmoo Choi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 132 days.

(21) Appl. No.: 17/119,580

(22) Filed: Dec. 11, 2020

(65) Prior Publication Data

US 2022/0190064 A1  Jun. 16, 2022

(51) Int. Cl.
*H01L 27/32* (2006.01)

(52) U.S. Cl.
CPC ...... *H01L 27/3244* (2013.01); *H01L 27/3234* (2013.01); *H01L 27/3211* (2013.01)

(58) Field of Classification Search
CPC ............................ H01L 27/3244–3279; G09G 2300/0439–0478
See application file for complete search history.

(56) References Cited

U.S. PATENT DOCUMENTS

| 7,808,540 B2 | 10/2010 | Cok |
| 10,269,874 B2 | 4/2019 | Madigan |
| 2021/0405260 A1 * | 12/2021 | He ........................ G06F 1/1609 |

FOREIGN PATENT DOCUMENTS

WO  WO 2020094222  11/2018

* cited by examiner

*Primary Examiner* — Suberr L Chi
(74) *Attorney, Agent, or Firm* — Fish & Richardson P.C.

(57) ABSTRACT

An apparatus is described that includes a light emitting diode (LED) display and a sensor. The LED display includes pixel emissive areas that are each coupled by a corresponding conductive trace to a corresponding pixel circuit that drives the respective pixel emissive area. The LED display has a high density region, a low density region, and a transition region between the high density region and the low density region. A pattern of the pixel circuits in the transition region matches a pattern of pixel circuits in the low density region, with at least some conductive traces that couple pixel emissive areas to pixel circuits in the transition region being longer than corresponding conductive traces that couple pixel emissive areas to pixel circuits in the low density region. The sensor is arranged to receive electromagnetic radiation transmitted through the low density region of the LED display.

20 Claims, 6 Drawing Sheets

DISPLAY STRUCTURE FOR SMOOTH TRANSITION BETWEEN DIFFERENT PIXEL DENSITY REGIONS IN AN OLED DISPLAY

TECHNICAL FIELD

The subject matter described herein relates to organic light emitting diode (OLED) displays, and more specifically to pixel arrangements in OLED displays.

BACKGROUND

In general, organic light emitting diode (OLED) displays are emissive flat panel displays featuring an array of pixels, each of which includes at least one OLED. During operation, a pixel circuit delivers electric current to the OLED, causing it to emit light. Pixels in full color OLED displays often include multiple sub-pixels, each emitting light of a different color. The sub-pixels are sufficiently small and closely-spaced such that a viewer perceives the multi-colored emission to emanate from a single point having a color corresponding to the combined spectral emissions of the sub-pixels.

SUMMARY

In some devices, such as smartphones, it is desirable to include front-facing sensors, i.e., sensors that face in the same direction as the device's display. Traditionally, such sensors (e.g., cameras, facial recognition sensors, proximity sensors, or ambient light sensors) have been housed in the display's bezel. However, it can be desirable to minimize the size of the display's bezel. In some cases, such as where the bezel is narrow, the front-facing sensors are positioned behind the display and detect light that is transmitted through the display.

In certain cases, the display can include a region with lower pixel density above the front-facing sensor. This can facilitate increased transmission of light through the display to the sensor, thereby improving the quality of any signal detected by the sensor. The sensor may be a specialized sensor that includes active illumination which passes through the display, reflects/scatters from an object in front of the device, and then sensed by the sensor. The sensor may include an associated emitter which may emit electromagnetic radiation in visible or infrared spectrum, and which may be incoherent or coherent. In such cases where a sensor is beneath a display, the display can include adjacent regions having different pixel densities, and therefore different resolutions.

When an organic light emitting diode (OLED) display has two adjacent regions with significantly different densities of pixels in those regions, the image rendered on the OLED display can have an undesirably sharp transition in image quality along the boundary of those two regions. A sharp transition can include a luminance that locally decreases in this transition zone or a luminance which is elevated at the transition zone. Similarly, the transition can include a localized shift in the hue or saturation of an otherwise homogeneous color field.

Visually, looking at a display with such discrete zones from a range of distances, the color and luminance of both zones may match, but there may be a perceptible gap between them. One way to describe this perturbation in the transition zone is as a luminance contrast between the transition zone and either of the adjacent zones. The perturbation may be calculated at a specific spatial frequency, or after a filtering operation. Organic light emitting diode (OLED) displays are described below where a transition between regions with different pixel densities are smoothed so that an undesirable visible transition in image quality along the boundary of these regions is reduced.

In one aspect, an apparatus is described that includes a light emitting diode (LED) display and a sensor. The LED display includes pixel emissive areas that are each coupled by a corresponding conductive trace to a corresponding pixel circuit that drives the respective pixel emissive area. The LED display has a high density region, a low density region, and a transition region between the high density region and the low density region. A density of pixel emissive areas in the high density region is higher than both a density of pixel emissive areas in the transition region and a density of pixel emissive areas in the low density region. A pattern of pixel emissive areas in the transition region is different from a pattern of pixel emissive areas in the high density region and in the low density region. A density of pixel circuits in the high density region is greater than a density of pixel circuits in the transition region. A pattern of the pixel circuits in the transition region matches a pattern of pixel circuits in the low density region, with at least some conductive traces that couple pixel emissive areas to pixel circuits in the transition region being longer than corresponding conductive traces that couple pixel emissive areas to pixel circuits in the low density region. The sensor is arranged to receive electromagnetic radiation transmitted through the low density region of the LED display.

In some variations, one or more of the following can be additionally implemented either individually or in any feasible combination. In some implementations, a first distance between a first pixel circuit in the transition region that drives a first pixel emissive area and the first pixel emissive area is more than a second distance between a second pixel circuit in the low density region that drives a second pixel emissive area and the second pixel emissive area, wherein the first pixel emissive area and the second pixel emissive area emit similar colors. In certain aspects, a first distance between a first pixel circuit in the transition region that drives a first pixel emissive area and the first pixel emissive area is more than a second distance between a second pixel circuit in the transition region that drives a second pixel emissive area and the second pixel emissive area, wherein the first pixel emissive area and the second pixel emissive area emit similar colors. In some aspects, the first pixel emissive area is closer to the high density region than the second pixel emissive area is to the high density region.

In some implementations, each of the pixel circuits in the low density region has a same distance to the pixel emissive area driven by the pixel circuit in the low density region. In certain aspects, each of the pixel circuits in the transition region drives two corresponding pixel emissive areas and the density of pixel emissive areas in the transition region is higher than a density of pixel emissive areas in the low density region. In some implementations, each of the pixel circuits in the transition region drives a corresponding pixel emissive area and the density of pixel emissive areas in the transition region matches a density of pixel emissive areas in the low density region. In certain aspects, the low density region is above the sensor and the sensor does not receive electromagnetic radiation transmitted through the transition region. In some aspects, the transition region surrounds the low density region.

In some implementations, the low density region is circular and the transition region is ring-shaped. In certain aspects, the low density region is circular and the transition region is square with a cut out in a center for the low density region. In some aspects, the transition region is curved and a number of corresponding pixel emissive areas that each of the pixel circuits in the transition region drives varies based on locations of the pixel circuits. In some aspects, the low density region is 10% or less of a total area of the LED display.

In some implementations, the transition region is 10% or less of a total area of the LED display. In certain aspects, the density of pixel emissive areas in the high density region is 400 pixels per inch or more and the density of pixel emissive areas in the transition region is 250 pixels per inch or less. In some aspects, the sensor is a camera. In some implementations, the apparatus is a smartphone. In some implementations, a density of the pixel emissive areas in the transition region is higher than a density of the pixel emissive areas in the low density region. In certain aspects, the sensor includes a component that emits second electromagnetic radiation transmitted through the low density region. In some aspects, the low density region allows emission of second electromagnetic radiation from the sensor.

As additional description to the embodiments described below, the present disclosure describes the following embodiments.

Embodiment 1 is an apparatus that comprises a light emitting diode (LED) display comprising pixel emissive areas that are each coupled by a corresponding conductive trace to a corresponding pixel circuit that drives the respective pixel emissive area, the LED display having a high density region, a low density region, and a transition region between the high density region and the low density region, wherein a density of pixel emissive areas in the high density region is higher than both a density of pixel emissive areas in the transition region and a density of pixel emissive areas in the low density region, wherein a pattern of pixel emissive areas in the transition region is different from a pattern of pixel emissive areas in the high density region and in the low density region, wherein a density of pixel circuits in the high density region is greater than a density of pixel circuits in the transition region, and wherein a pattern of the pixel circuits in the transition region matches a pattern of pixel circuits in the low density region, with at least some conductive traces that couple pixel emissive areas to pixel circuits in the transition region being longer than corresponding conductive traces that couple pixel emissive areas to pixel circuits in the low density region, and a sensor arranged to receive electromagnetic radiation transmitted through the low density region of the LED display.

Embodiment 2 is an apparatus of Embodiment 1, wherein a first distance between a first pixel circuit in the transition region that drives a first pixel emissive area and the first pixel emissive area is more than a second distance between a second pixel circuit in the low density region that drives a second pixel emissive area and the second pixel emissive area, wherein the first pixel emissive area and the second pixel emissive area emit similar colors.

Embodiment 3 is the apparatus of any one of embodiments 1 through 2, wherein a first distance between a first pixel circuit in the transition region that drives a first pixel emissive area and the first pixel emissive area is more than a second distance between a second pixel circuit in the transition region that drives a second pixel emissive area and the second pixel emissive area, wherein the first pixel emissive area and the second pixel emissive area emit similar colors.

Embodiment 4 is the apparatus of Embodiment 3, wherein the first pixel emissive area is closer to the high density region than the second pixel emissive area is to the high density region.

Embodiment 5 is the apparatus of any one of Embodiments 1 through 4, wherein each of the pixel circuits in the low density region has a same distance to the pixel emissive area driven by the pixel circuit in the low density region.

Embodiment 6 is the apparatus of any one of Embodiments 1 through 5, wherein each of the pixel circuits in the transition region drives two corresponding pixel emissive areas and the density of pixel emissive areas in the transition region is higher than a density of pixel emissive areas in the low density region.

Embodiment 7 is the apparatus of any one of Embodiments 1 through 5, wherein each of the pixel circuits in the transition region drives a corresponding pixel emissive area and the density of pixel emissive areas in the transition region matches a density of pixel emissive areas in the low density region.

Embodiment 8 is the apparatus of any one of Embodiments 1 through 7, wherein the low density region is above the sensor and the sensor does not receive electromagnetic radiation transmitted through the transition region.

Embodiment 9 is the apparatus of any one of Embodiments 1 through 8, wherein the transition region surrounds the low density region.

Embodiment 10 is the apparatus of any one of Embodiments 1 through 9, wherein the low density region is circular and the transition region is ring-shaped.

Embodiment 11 is the apparatus of any one of Embodiments 1 through 9, wherein the low density region is circular and the transition region is square with a cut out in a center for the low density region.

Embodiment 12 is the apparatus of any one of Embodiments 1 through 9, wherein the transition region is curved and a number of corresponding pixel emissive areas that each of the pixel circuits in the transition region drives varies based on locations of the pixel circuits.

Embodiment 13 is the apparatus of any one of Embodiments 1 through 12, wherein the low density region is 10% or less of a total area of the OLED display.

Embodiment 14 is the apparatus of any one of Embodiments 1 through 13, wherein the transition region is 10% or less of a total area of the OLED display.

Embodiment 15 is the apparatus of any one of Embodiments 1 through 14, wherein the density of pixel emissive areas in the high density region is 400 pixels per inch or more and the density of pixel emissive areas in the transition region is 250 pixels per inch or less.

Embodiment 16 is the apparatus of any one of Embodiments 1 through 15, wherein the sensor is a camera.

Embodiment 17 is the apparatus of any one of Embodiments 1 through 16, wherein the apparatus is a smartphone.

Embodiment 18 is the apparatus of any one of Embodiments 1 through 13, wherein a density of the pixel emissive areas in the transition region is higher than a density of the pixel emissive areas in the low density region.

Embodiment 19 is the apparatus of any one of Embodiments 1 through 18, wherein the sensor includes a component that emits second electromagnetic radiation transmitted through the low density region.

Embodiment 20 is the apparatus of any one of Embodiments 1 through 19, wherein the low density region allows emission of second electromagnetic radiation from the sensor.

The implementations discussed herein are advantageous. For example, the smooth transition in different pixel density regions in the OLED display avoids undesirable sharp transition at borders, thereby making the emissive properties of the image substantially uniform across the display including over the sensors and the transition between discrete zones. Such OLED displays can also facilitate operation of sensors placed behind the display by providing a low pixel density region through which light can propagate to the sensor.

The details of one or more implementations are set forth below. Other features and advantages of the subject matter will be apparent from the detailed description, the accompanying drawings, and the claims.

BRIEF DESCRIPTION OF THE DRAWINGS

Like reference symbols in the various drawings indicate like elements.

DETAILED DESCRIPTION

Figure 1:
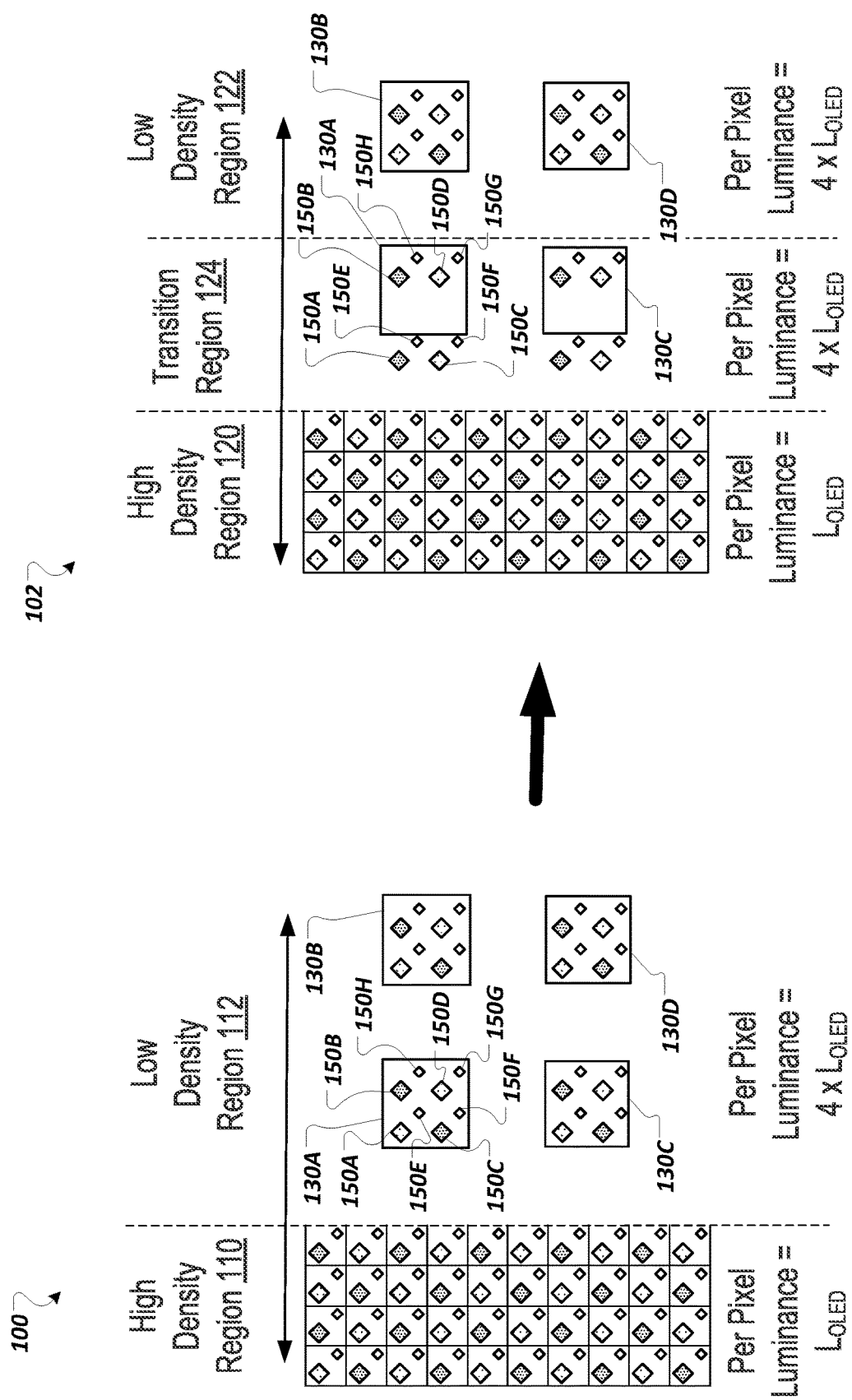
FIG. 1 illustrates a boundary between a high density region of an example OLED display and a low density region smoothed by an addition of a transition region.

FIG. 1 illustrates a boundary between a high density region 120 of an example OLED display 102 and a low density region 122 smoothed by an addition of a transition region 124. The OLED display 102 may be part of an apparatus and positioned above a sensor of the apparatus so electromagnetic radiation transmitted through the low density region 122 of the OLED display 102 is sensed by the sensor. For example, the OLED display 102 may be part of a smartphone and the sensor may be a camera of the smartphone that is positioned below the OLED display 102. The sensor may be positioned such that the camera senses light that transmits through the low density region 122 and the transition region 124 smooths out undesirable changes in luminance and chrominance between the low density region 122 and the high density region 120.

FIG. 1 shows another OLED display 100 without a transition region between a high density region 110 and a low density region 112. The OLED display 100 is shown for comparison purposes to the OLED display 102. The OLED displays 100, 102 include pixels that are emissive areas, also referred to herein as pixel emissive areas, that emit light. For example, emissive area 150A may emit blue light, emissive area 150B may emit red light, emissive area 150C may emit red light, emissive area 150D may emit blue light, and emissive areas 150E-G may emit green light.

The OLED displays 100, 102 include additional emissive areas that are not labeled for visibility purposes. For example, FIG. 1 shows thirty two emissive areas in the low density region 112, eighty emissive areas in the high density region 110, eighty emissive areas in the high density region 120, sixteen emissive areas in the transition region, and sixteen emissive areas in the low density region 122. The small diamonds may correspond to green emissive areas, the dark large diamonds may correspond to red emissive areas, and the light large diamonds may correspond to blue emissive areas.

The OLED display 100 shows the high density region 110 with four times the density of emissive areas than the low density region 112. The greater spacing of the emissive areas in the low density region 112 may allow for more electromagnetic radiation to reach a sensor below the OLED display 100 as fewer emissive areas along with reduced wiring and support circuitry may block less electromagnetic radiation from reaching the sensor.

The high density region 110 and the low density region 112 may have different patterns of emissive areas. A pattern of emissive areas may be defined based on distances between adjacent emissive areas. For example, the high density region 110 may have a pattern of emissive areas where red emissive areas are spaced out at uniform distances, blue emissive areas are spaced out at uniform distances, and green emissive areas are spaced out at uniform distances. On the other hand, the low density region 112 may have pattern of emissive areas where groups of eight emissive areas in the low density region 112 have a same relative position to corresponding emissive areas in the high density region 110, but the groups of eight emissive areas are spaced out from one another so that a density of the emissive areas is a quarter of the high density region 110.

As shown in FIG. 1, a luminance of each emissive area LOLED in the low density regions 112, 122 and the transition region 124 may be four times that of the emissive areas in the high density regions 110, 120 to offset the lower pixel density to result in a similar overall luminance across the regions.

The high density region 120 may have a similar pattern to the high density region 110, the low density region 122 may have a similar pattern to the low density region 112, and the transition region 124 may have a different pattern of emissive areas than both the high density region 120 and the low density region 122. For example, in the transition region 124, spacing of the emissive areas 150A, 150C, 150E, and 150F to one another may be similar to in the low density region 112, but the emissive areas 150A, 150C, 150E, and 150F may be farther spaced apart from the emissive areas 150B, 150D, 150G, 150H in the transition region 124 than in the low density region 112. Spacing the emissive areas 150A, 150C, 150E, and 150F closer to the high density region 120 may reduce a dark space at a border of the high density region 120.

The emissive areas in the OLED display 100 are driven by pixel circuits. For example, the emissive area 150A may be driven by a first pixel circuit, the emissive area 150B may be driven by a second pixel circuit, and the other emissive areas 150C-150G may similarly be driven by a corresponding pixel circuit. The pixel circuits may output current that is received at the emissive areas, and the current may cause the emissive areas to emit light. The pixel circuits may be spatially grouped in order to maximize open aperture for the sensor. For example, the circuit group 130A may include eight pixel circuits that each drive one of the emissive areas 150A-G, and the low density regions 112 may include multiple other circuit groups 130B-130D. Alternatively, within a spatially clustered group of pixel circuits, e.g. 130A, there may be as few as three pixel circuits that are wired up to respective like-color subpixels. This can permit additional reductions in circuit and trace complexity while increasing the transmittance.

The emissive areas may be positioned above the pixel circuits that drive the emissive areas and may be electrically coupled to the pixel circuits by conductive traces. For example, all the emissive areas in the OLED display 100 may be in one layer that is above a second layer that includes the pixel circuits, and the second layer may be above a sensor.

A pixel circuit may be centered below an emissive area driven by the pixel circuit. Centering the pixel circuit directly below the emissive area may reduce a distance between the pixel circuit and the emissive area, which may reduce image degradation from traces, and image degradation from the pixel circuit while maximizing total transmittance. For example, a pixel circuit centered below an emissive area may block less light from reaching a sensor below the pixel circuit than a pixel circuit that is not centered below an emissive area, as the emissive area may already block some light from reaching the sensor. The positions of the emissive areas and the pixel circuits may be set during fabrication of the display panel.

A pattern of pixel circuits in the high density region 110 may be different than a pattern of pixel circuits in the low density region 112. For example, the low density region 112 may have only a quarter of the pixel circuits as the high density region 110, and the pixel circuits may be in clusters of eight that are spaced apart from one another.

A pattern of pixel circuits may refer to locations of pixel circuits relative to each other, and may be defined based on distances between adjacent pixel circuits.. For example, a first pattern of pixel circuits in the high density region 120 may be a repeating pattern of: a diamond formation of eight pixel circuits for red emissive areas, a diamond formation of eight pixel circuits for blue emissive areas, and a grid formation of sixteen pixel circuits for green emissive areas, and a second pattern of pixel circuits in the transition region 124 and the low density region 122 may both be the same and similar to the first pattern with only the lower right quadrant of pixel circuits that include two pixel circuits for red emissive areas, two pixel circuits for blue emissive areas, and four pixel circuits for green emissive areas.

A pattern of pixel circuits in the high density region 120 may match the pattern in the high density region 110, a pattern of pixel circuits in the low density region 122 may match the pattern in the low density region 112, and a pattern of pixel circuits in the transition region 124 may match a pattern of pixel circuits in the low density region 122.

For example, in the transition region 124, the emissive areas 150A, 150C, 150E, 150F may not be centered above the pixel circuits that drive the emissive areas 150A, 150C, 150E, 150F, and instead the pixel circuits may be in a same pattern as in the low density region 122 and the pixel circuits may be electrically coupled to the corresponding emissive area by conductive traces that extend laterally from the pixel circuits. Having a pattern of pixel circuits in the transition region 124 and the low density region 122 that is the same may reduce complexity and costs while increasing the transmittance and open aperture for the sensor.

Figure 2:
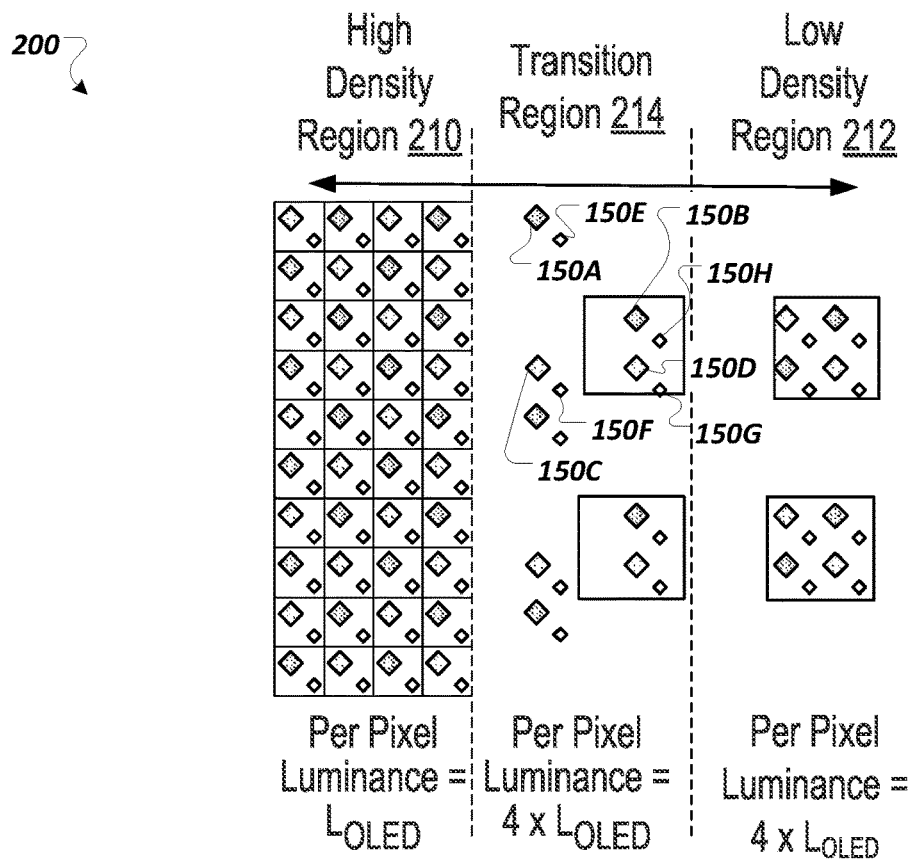
FIG. 2 illustrates an example OLED display with a transition region with another pattern of emissive areas.

FIG. 2 illustrates an example OLED display 200 with another transition region 214 with another pattern of emissive areas. The OLED display 200 includes a high density region 210 that matches the high density region 120, a low density region 212 that matches the low density region 122, and the transition region 214 between the high density region 210 and the low density region 212. The transition region 214 may have a pattern of pixel circuits that is similar to the low density region 212. For example, the pixel circuits in both the transition region 214 and the low density region 212 may be in groups of eight that are spaced out from other groups. However, a pattern of emissive areas in the transition region 214 may be different from the low density region 212 and the transition region 124. For example, as shown in FIG. 2, the emissive areas 150A, 150E may be to the upper left of the pixels circuits that drive the emissive areas 150A, 150E, and the emissive areas 150C, 150F may be to the left of the pixel circuits that drive the emissive areas 150C, 150F.

Figure 3:
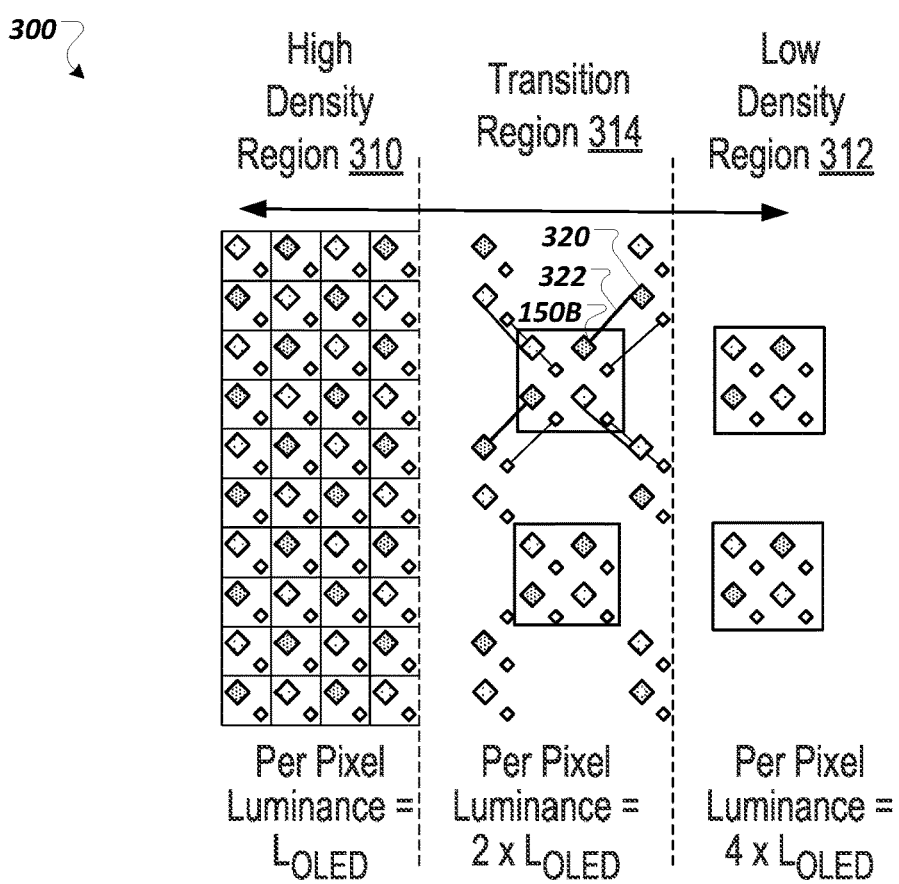
FIG. 3 illustrates an example OLED display with another transition region with two emissive areas driven per pixel circuit.

FIG. 3 illustrates an example OLED display 300 with another transition region 314 with two emissive areas driven per pixel circuit. The OLED display 300 includes a high density region 310 that matches the high density region 120, a low density region 312 that matches the low density region 122, and the transition region 314 between the high density region 310 and the low density region 312. The transition region 314 may have a pattern of pixel circuits that is similar to the low density region 312. For example, the pixel circuits in both the transition region 314 and the low density region 312 may be in groups of eight that are spaced out from other groups. However, a pattern of emissive areas in the transition region 314 may be different from the low density region 312 and the transition region 124. For example, as shown in FIG. 3, the emissive areas 320, 150B may both be driven by a single pixel circuit, where the emissive area 320 is to the upper right of the emissive area 150B and coupled to the single pixel circuit by a conductive trace 322.

Similarly, while not labeled, the other pixel circuits may drive pairs of emissive areas. The transition region 314 may have half the pixel density of the high density region 310 and double the pixel density of the low density region 312. As shown in FIG. 3, a luminance of each emissive area LoLED in the transition region 314 may be two times that of the emissive areas in the high density regions 310 to offset the lower pixel density to result in a similar overall luminance across the regions.

Figure 4:
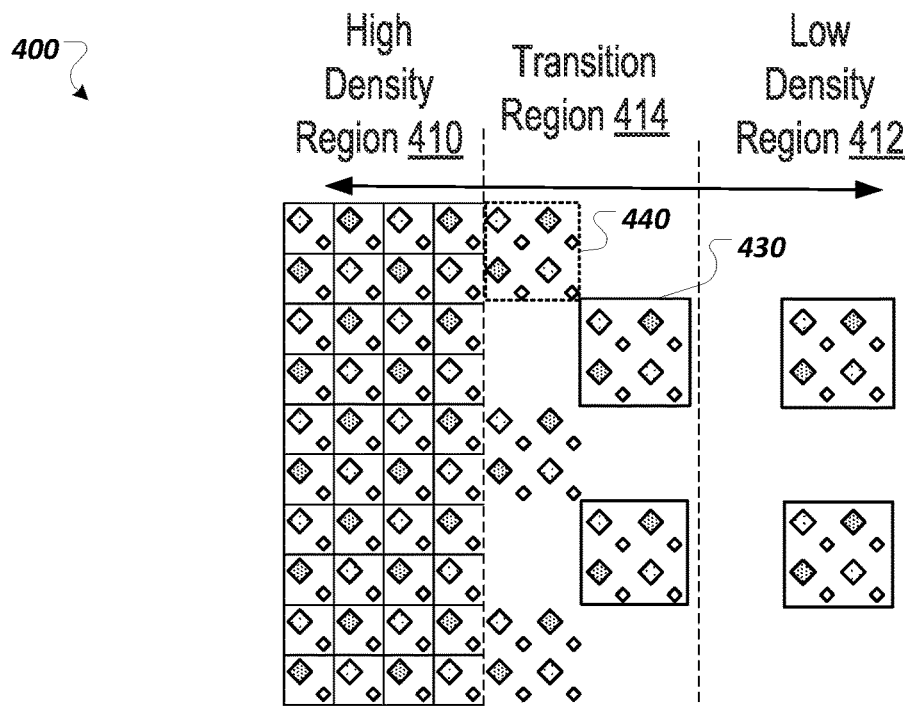
FIG. 4 illustrates an example OLED display with another transition region with second emissive areas that are closer to the high density region than pixel circuits that drive the second emissive areas.

FIG. 4 illustrates an example OLED display 400 with another transition region 414 with second emissive areas that are closer to the high density region 410 than pixel circuits that drive the second emissive areas. The OLED display 400 includes a high density region 410 that matches the high density region 120, a low density region 412 that matches the low density region 122, and the transition region 414 between the high density region 410 and the low density region 412. The transition region 414 may have a pattern of pixel circuits that is similar to the low density region 412. For example, the pixel circuits in both the transition region 414 and the low density region 412 may be in groups of eight that are spaced out from other groups. However, a pattern of emissive areas in the transition region 414 may be different from the low density region 412 and the transition region 124. For example, as shown in FIG. 4, a cluster 440 of emissive areas may be driven by a group 430 of pixel circuits centered below corresponding emissive areas, where each pixel circuit in the group 430 drives both an emissive area in the cluster 440 and another emissive area directly above the pixel circuit. As shown, the cluster 440 may be to the upper left of the pixel groups that drive the cluster.

However, the cluster 440 may be instead to the lower left, or some other position. The example in FIG. 4 shows eight pixel circuits are used to drive the eight emissive areas within a shown square around the group 430, but emissive areas that correspond to the group 430 may use as few as three pixel circuits to drive the pixels.

Figure 5:
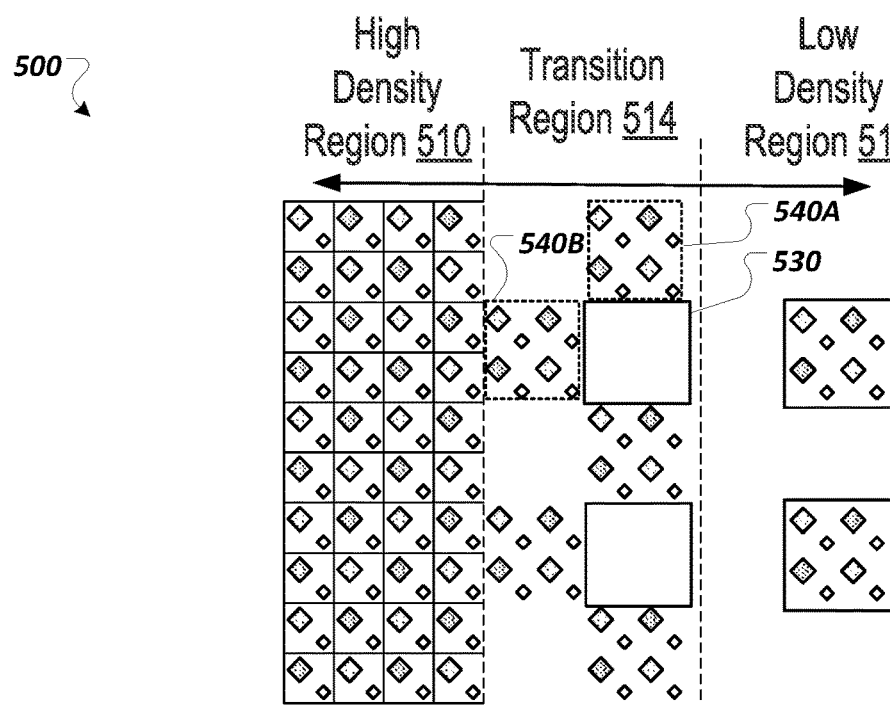
FIG. 5 illustrates an example OLED display with another transition region with no emissive areas that are in a similar position to the emissive areas in the low density region.

FIG. 5 illustrates an example OLED display 500 with another transition region 514 with no emissive areas that are in a similar position to the emissive areas in the low density region. The OLED display 500 includes a high density region 510 that matches the high density region 120, a low density region 512 that matches the low density region 122, and the transition region 514 between the high density region 510 and the low density region 512. The transition region 514 may have a pattern of pixel circuits that is similar to the low density region 512. For example, the pixel circuits in both the transition region 514 and the low density region 512 may be in groups of eight that are spaced out from other groups. However, a pattern of emissive areas in the transition region 514 may be different from the low density region 512 and the transition region 124. For example, as shown in FIG. 5, two clusters 540A, 540B of emissive areas may be driven by a group 530 of pixel circuits that are not centered below emissive areas of either of the clusters 540A, 540B where the cluster 540A is above the group 530 of pixel circuits and the cluster 540B is to the left.

Figure 6:
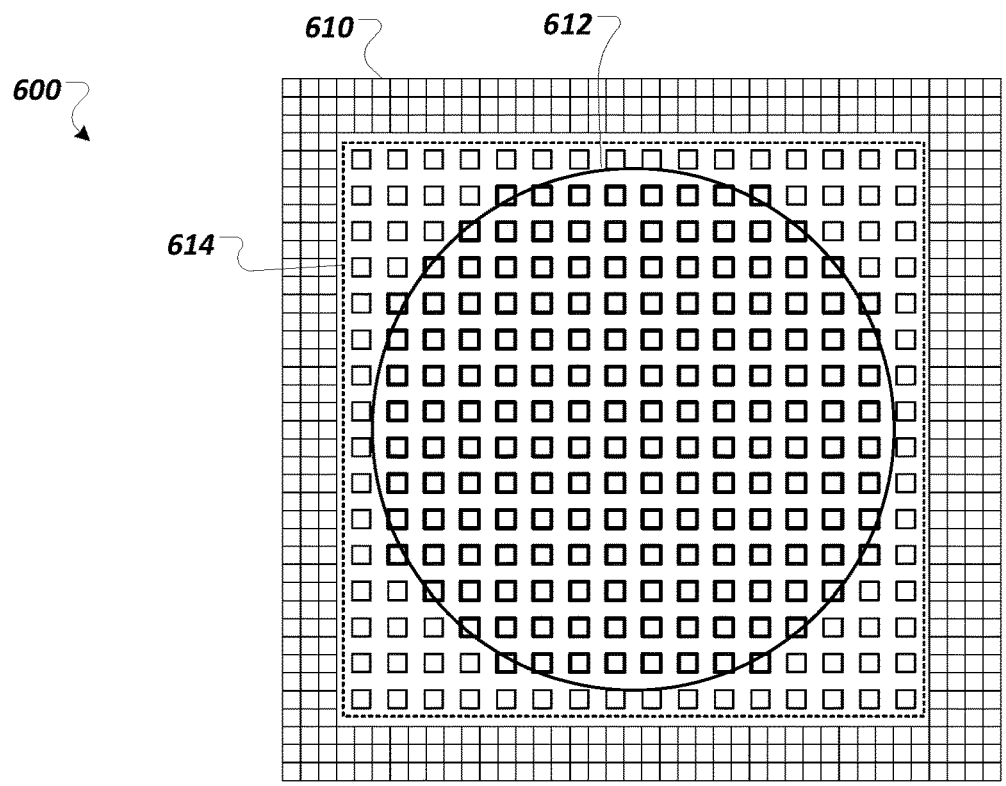
FIG. 6 illustrates an example OLED display with a square transition region.

FIG. 6 illustrates an example OLED display 600 with a square transition region 614. As shown, the high density region 610 may surround the square transition region 614, and a circular low density region 612 may be surrounded by the square transition region 614. A sensor may be located beneath the low density region 612.

Figure 7:
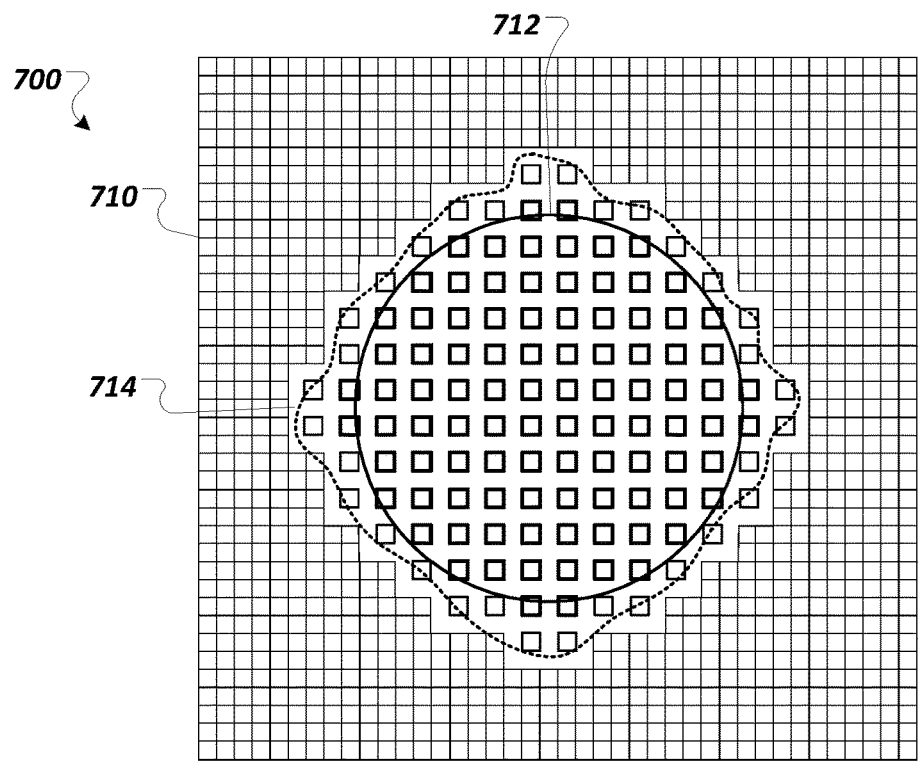
FIG. 7 illustrates an example OLED display with a diamond transition region.

FIG. 7 illustrates an example OLED display 700 with a diamond transition region 714. As shown, the high density region 710 may surround the diamond transition region 714, and a circular low density region 712 may be surrounded by the diamond transition region 714. A sensor may be located beneath the low density region 712.

Figure 8:
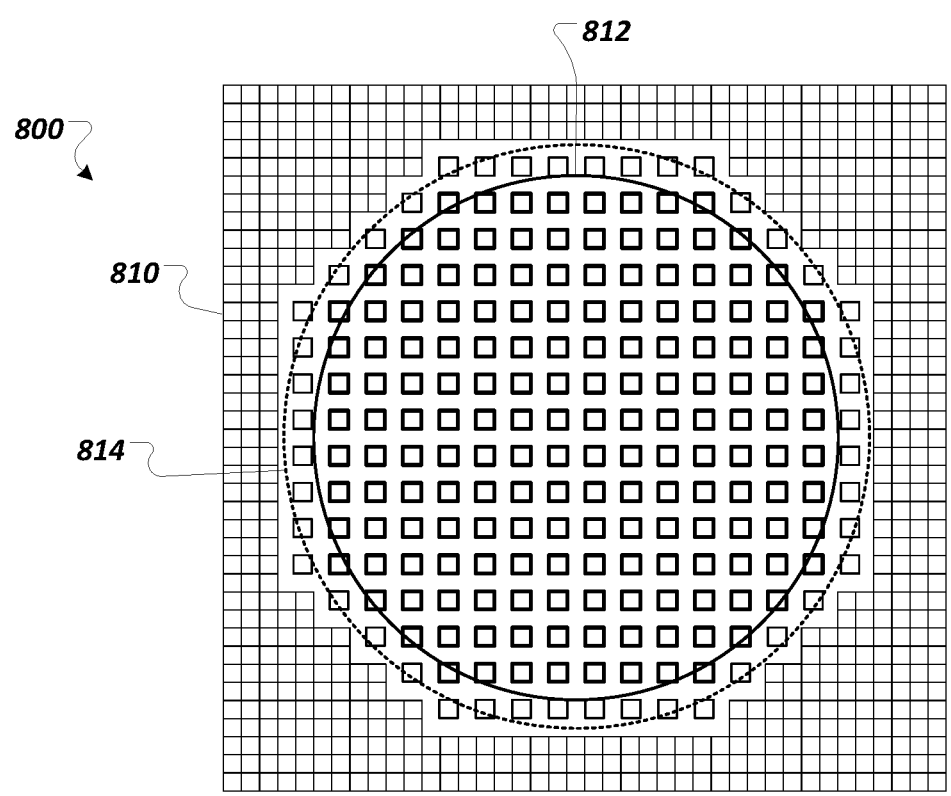
FIG. 8 illustrates an example OLED display with a ring-shaped transition region.

FIG. 8 illustrates an example OLED display 800 with a ring-shaped transition region 814. As shown, the high density region 810 may surround the ring-shaped transition region 814, and a circular low density region 812 may be surrounded by the ring-shaped transition region 814. A sensor may be located beneath the low density region 812.

Figure 9:
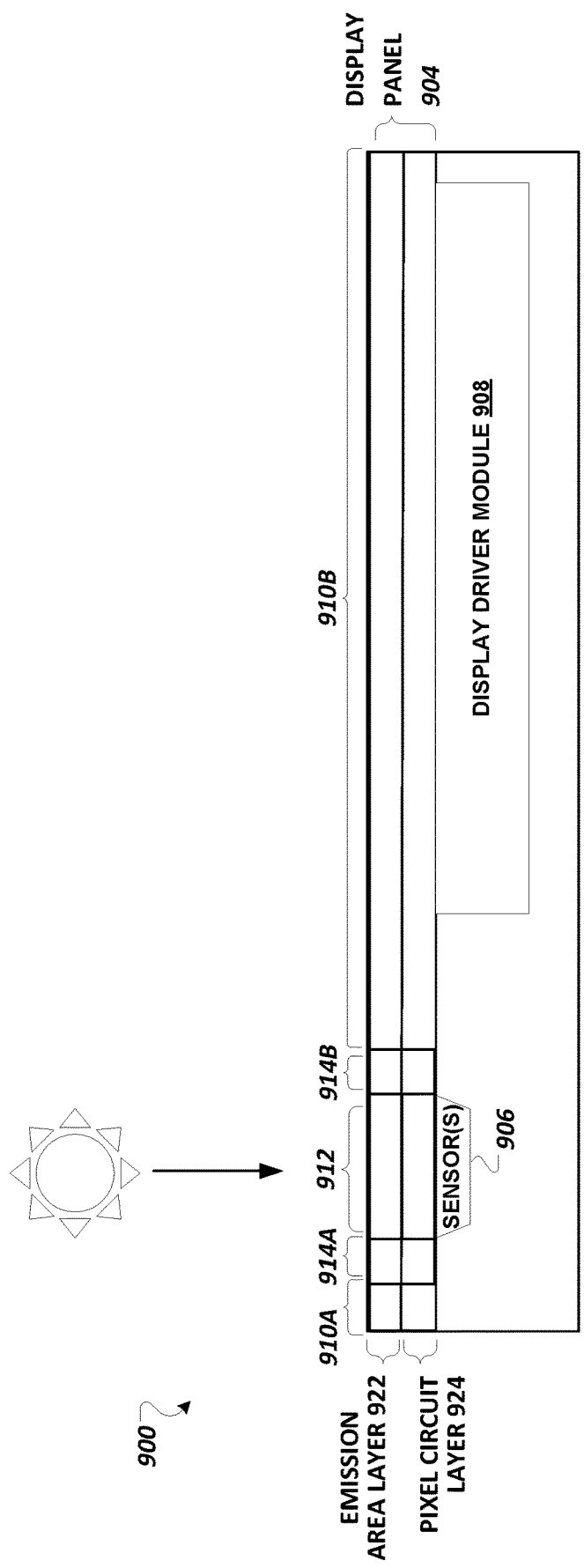
FIG. 9 illustrates a cross-sectional view of an example apparatus with an OLED display with a transition region.

FIG. 9 illustrates a cross-sectional view of an example apparatus 900 with an OLED display 904 with a transition region 914A, 914B. The cross-sectional view cuts through a sensor 906 of the apparatus 900. For example, the portion of the apparatus 900 closest to a top side of FIG. 9 may correspond to a front of the apparatus 900, the portion of the apparatus 900 closest to a bottom side of FIG. 9 may correspond to a back of the apparatus 900, the portion of the apparatus 900 closest to a left side of FIG. 9 may correspond to a top of the apparatus 900, and the portion of the apparatus 900 closest to a right side of FIG. 9 may correspond to a bottom of the apparatus 900.

The transition region 914A, 914B may be any of the transition regions described above in FIGS. 1-8. For example, the transition region 914A, 914B may be different parts of a cross-section of the ring-shaped transition region 814. The transition region 914A, 914B surrounds a low density region 912, and is surrounded by a high density region 910A, 910B. The low density region 912 may be any of the low density regions described above in FIGS. 1-8 and the high density region 910A, 910B may be any of the high density regions described above in FIGS. 1-8.

The OLED display 904 includes an emissive area layer 922 that is above a pixel circuit layer 924, and the pixel circuit layer 924 is above the sensor 906. The sensor 906 is shown centered below the low density region 912. The portion of the pixel circuit layer 924 in the transition region 914A, 914B may have a pattern that matches the portion of the pixel circuit layer 924 in the low density region 912, and the portion of the emissive area layer 922 in the transition region 914A, 914B may have a pattern that does not match the portion of the emissive area layer 922 in the low density region 912.

The apparatus 900 that includes the OLED display 904 may include a display driver module 908 (e.g., including a processor, such as a GPU, and/or other appropriate integrated circuit devices), housed within the apparatus 900, that controls the operation of the OLED display 904 by processing image data and generating appropriate drive signals for activating pixels in the display 904 to present images.

Generally, resolution can be measured in pixels per inch and typically depends on the size of the display, its intended use (e.g., how far from the display the intended viewing distance is), and manufacturing constraints, for example. Displays with small form factors, such as those used in mobile devices intended for close viewing, can include regions with high pixel densities, such as greater than three hundred pixels per inch (e.g., 400 pixels per inch or more, 500 pixels per inch or more) for example. The pixel density of a low density region display can be determined based on the transmittance of light through the low pixel density region needed for satisfactory operation of the front-facing sensors. In some embodiments, the low pixel density can be in the range of 270 pixels per inch or less (e.g., 270 pixels per inch or less, 260 pixels per inch or less, 120 pixels per inch or less, 100 pixels per inch or less, 80 pixels per inch or less).

In some examples, the pixel-resolution in the low density region 912 can be between one hundred twenty five pixels per inch and one hundred seventy five pixels per inch, the pixel-resolution in the high density region 910A, 910B can be between four hundred pixels per inch and four hundred seventy five pixels per inch. These pixel-resolution values are merely exemplary.

Moreover, while a particular arrangement of differing pixel density regions is shown in FIGS. 1-9, more generally, the size and location of these regions can vary as appropriate. A low pixel density region may be located over a front-facing sensor and should be sufficiently large to provide adequate field of view and light transmissivity of electromagnetic radiation through the display to and from the sensor. In some implementations where there are multiple front-facing sensors, each of the sensors may be below a corresponding low pixel density region that is surrounded by a transition region. Accordingly, in some embodiments, the low pixel density region can be situated at an edge of the display, e.g., at the top edge. The low density region 912 may occupy a small amount of the total area of the display (e.g., 10% or less, 5% or less, 2% or less).

Generally, the high pixel density region should occupy the majority of the display, providing the highest image quality and therefore best user experience. In some embodiments, the high pixel density region can be 80% or more (e.g., 90% or more, 95% or more) of the total display area. A transition region is generally arranged between the low pixel density region and the high pixel density region. This transition region may be narrow such that the size of the low resolution region is minimized. This transition region may be sufficiently large to provide a smooth transition in pixel density from the low pixel density region to the high pixel density region, as perceived by the user.

In general, the geometry of each pixel in different regions of the display can be the same or can be different. For example, the size and shape of the OLED for each same-colored emissive area can be the same or substantially similar. Identical sizes of such OLEDs in various regions means that with the increase in pixel density (as measured in pixels per inch) between regions, there is a corresponding decrease in space, per inch of display, between each pixel that does not emit light.

As noted above, the physical location and dimension (i.e., physical space) of low pixel density region corresponds to the location and dimension of sensors in the computing device.

The sensors can include an image sensor (e.g., a camera), a proximity sensor, an ambient light sensor, an accelerometer, a gyrometer, a magnetometer, a fingerprint sensor, a barometer, a Hall effect sensor, a facial recognition sensor, any other one or more sensors, and/or any combination thereof. At least one sensor can include a transmitter and a receiver.

The OLED display 904 can be driven with an active matrix display scheme, and the OLED display can be referred to as an active matrix organic light emitting diode (AMOLED) display. The active matrix display scheme can be advantageous over a passive matrix display scheme in a passive matrix organic light emitting diode (PMOLED) display, as AMOLED displays can provide higher refresh rates than PMOLED displays, and consume significantly less power than PMOLED displays.

The apparatus 900 can be a mobile device, such as a phone, a tablet computer, a phablet computer, a laptop computer, a wearable device such as a smartwatch, a digital camera, any other one or more mobile device, and/or the like. In alternate implementations, the apparatus can be any other computing device such as a desktop computer, a kiosk computer, a television, and/or any other one or more computing devices that are configured to output visual data.

An apparatus may include a light emitting diode (LED) display comprising pixel emissive areas that are each coupled by a corresponding conductive trace to a corresponding pixel circuit that drives the respective pixel emissive area, the LED display having a high density region, a low density region, and a transition region between the high density region and the low density region, wherein a density of pixel emissive areas in the high density region is higher than both a density of pixel emissive areas in the transition region and a density of pixel emissive areas in the low density region, wherein a pattern of pixel emissive areas in the transition region is different from a pattern of pixel emissive areas in the high density region and in the low density region, wherein a density of pixel circuits in the high density region is greater than a density of pixel circuits in the transition region, and wherein a pattern of the pixel circuits in the transition region matches a pattern of pixel circuits in the low density region, with at least some conductive traces that couple pixel emissive areas to pixel circuits in the transition region being longer than corresponding conductive traces that couple pixel emissive areas to pixel circuits in the low density region, and a sensor arranged to receive electromagnetic radiation transmitted through the low density region of the LED display.

For example, a smartphone may include the OLED display 102 that includes the high density region 120 that has a pixel density of 400 pixels per inch, the transition region 124 that has a pixel density of 100 pixels per inch, and the low density region 122. In the example, the transition region 124 is arranged between the high density region 120 and the low density region 122, a pattern of pixel circuits in the transition region 124 is in groups of eight that are spaced apart from other groups that is the same as the pattern of pixel circuits in the low density region 122, and a pattern of emissive areas in the transition region 124 has emissive areas that are spaced apart different than in a pattern of emissive areas in the low density region 122.

In some implementations, a first distance between a first pixel circuit in the transition region that drives a first pixel emissive area and the first pixel emissive area is more than a second distance between a second pixel circuit in the low density region that drives a second pixel emissive area and the second pixel emissive area, where the first pixel emissive area and the second pixel emissive area emit similar colors. For example, the emissive area 150A may be driven by a pixel circuit that is not centered below the emissive area 150A, and the low density region 122 may include pixel circuits that are centered below blue emissive areas that are driven by the pixel circuits.

In some implementations, a first distance between a first pixel circuit in the transition region that drives a first emissive area and the first emissive area is more than a second distance between a second pixel circuit in the transition region that drives a second emissive area and the second emissive area, where the first emissive area and the second emissive area emit similar colors. For example, the emissive area 150A may be driven by a pixel circuit that is not centered below the emissive area 150A and the emissive area 150D may be driven by a pixel circuit that is centered below the emissive area 150D. In some implementations, a first emissive area is closer to the high density region than the second emissive area is to the high density region. For example, the emissive area 150A is closer to the high density region 120 than the emissive area 150D. In some implementations, each of the pixel circuits in the low density region has a same distance to the emissive area driven by the pixel circuit in the low density region. For example, each of the emissive areas in the low density region 122 may be driven by a pixel circuit that is centered below the emissive area.

In some implementations, each of the pixel circuits in the transition region drives two corresponding pixel emissive areas and the density of pixel emissive areas in the transition region is higher than a density of pixel emissive areas in the low density region. For example, the emissive areas 150B and 310 may be driven by the same pixel circuit and the pixel density of the transition region 314 may be 200 pixels per inch and the pixel density of the low density region may be 100 pixels per inch.

In some implementations, each of the pixel circuits in the transition region drives a corresponding pixel emissive area and the density of pixel emissive areas in the transition region matches a density of pixel emissive areas in the low density region. For example, the pixel density of the transition region 124 and the low density region 122 may both be 100 pixels per inch, and a pixel density of the high density region 120 may be 400 pixels per inch. In some implementations, the low density region is above the sensor and the sensor does not receive electromagnetic radiation transmitted through the transition region. For example, a camera beneath the OLED display 700 may be centered and directly below the low density region 712, and the camera may only receive electromagnetic radiation transmitted through the low density region 712.

In some implementations, the transition region surrounds the low density region. For example, the transition region 714 surrounds the low density region 712. In some implementations, the low density region is circular and the transition region is ring-shaped. For example, as shown in FIG. 8, the low density region 812 is circular and the transition region 814 is ring-shaped. In some implementations, the low density region is circular and the transition region is square with a cut out in a center for the low density region. For example, the transition region 614 is square with a cut out in a center for the low density region 612.

In some implementations, the transition region is curved and a number of corresponding pixel emissive areas that each of the pixel circuits in the transition region drives varies based on locations of the pixel circuits. For example, the pixel circuits that are closer towards a high density region may drive two emissive areas and pixel circuits that are farther from the high density region may drive only a single emissive area. In some implementations, the low density region is 10% or less of a total area of the LED display. For example, the low density region 122 may be 10% of the total area of the OLED display 102. In some implementations, the transition region is 10% or less of a total area of the LED display. For example, the transition region 124 may be 10% of the total area of the OLED display 102. In some implementations, the density of pixel emissive areas in the high density region is 400 pixels per inch or more and the density of pixel emissive areas in the transition region is 250 pixels per inch or less. For example, the first pixel density may be 400 pixels per inch and the second pixel density may be 200 pixels per inch.

In the implementations depicted in the Figures, a pixel arrangement is shown that is based on retaining one of four high resolution pixels. Various implementations are possible that retain any subset of the high resolution pixels such as one of two, or one of three. Furthermore, the depicted high resolution regions illustrated have a clustering structure but these techniques should be understood to apply to the transition zone between any low resolution region and high resolution region on a single display.

Various implementations of the subject matter described herein (e.g., the computing device, the display, and/or any other component associated with such computing device and/or the display) can be implemented in digital electronic circuitry, integrated circuitry, specially designed application specific integrated circuits (ASICs), computer hardware, firmware, software, and/or combinations thereof. These various implementations can be implemented in one or more computer programs. These computer programs can be executable and/or interpreted on a programmable system. The programmable system can include at least one programmable processor, which can have a special purpose or a general purpose. The at least one programmable processor can be coupled to a storage system, at least one input device, and at least one output device. The at least one programmable processor can receive data and instructions from, and can transmit data and instructions to, the storage system, the at least one input device, and the at least one output device.

These computer programs (also known as programs, software, software applications or code) can include machine instructions for a programmable processor, and can be implemented in a high-level procedural and/or object-oriented programming language, and/or in assembly or machine language. As can be used herein, the term "machine-readable medium" can refer to any computer program product, apparatus and/or device (for example, magnetic discs, optical disks, memory, programmable logic devices (PLDs)) used to provide machine instructions and/or data to a programmable processor, including a machine-readable medium that can receive machine instructions as a machine-readable signal. The term "machine-readable signal" can refer to any signal used to provide machine instructions and/or data to a programmable processor.

To provide for interaction with a user, the display can display data to a user. The sensors can receive data from the one or more users and/or the ambient environment. The computing device can thus operate based on user or other feedback, which can include sensory feedback, such as visual feedback, auditory feedback, tactile feedback, and any other feedback. To provide for interaction with the user, other devices can also be provided, such as a keyboard, a mouse, a trackball, a joystick, and/or any other device. The input from the user can be received in any form, such as acoustic input, speech input, tactile input, or any other input.

Although various implementations have been described above in detail, other modifications can be possible. For example, the logic flows described herein may not require the particular sequential order described to achieve desirable results. Other implementations are within the scope of the following claims.

What is claimed is:

1. An apparatus comprising:
    a light emitting diode (LED) display comprising pixel emissive areas that are each coupled by a corresponding conductive trace to a corresponding pixel circuit that drives the respective pixel emissive area, the LED display having a high density region, a low density region, and a transition region between the high density region and the low density region,
    wherein a density of pixel emissive areas in the high density region is higher than both a density of pixel emissive areas in the transition region and a density of pixel emissive areas in the low density region,
    wherein a pattern of pixel emissive areas in the transition region is different from a pattern of pixel emissive areas in the high density region and in the low density region,
    wherein a density of pixel circuits in the high density region is greater than a density of pixel circuits in the transition region, and
    wherein a pattern of the pixel circuits in the transition region matches a pattern of pixel circuits in the low density region, with at least some conductive traces that couple pixel emissive areas to pixel circuits in the transition region being longer than corresponding conductive traces that couple pixel emissive areas to pixel circuits in the low density region; and
    a sensor arranged to receive electromagnetic radiation transmitted through the low density region of the LED display.

2. The apparatus of claim 1, wherein a first distance between a first pixel circuit in the transition region that drives a first pixel emissive area and the first pixel emissive area is more than a second distance between a second pixel circuit in the low density region that drives a second pixel emissive area and the second pixel emissive area, wherein the first pixel emissive area and the second pixel emissive area emit similar colors.

3. The apparatus of claim 1, wherein a first distance between a first pixel circuit in the transition region that drives a first pixel emissive area and the first pixel emissive area is more than a second distance between a second pixel circuit in the transition region that drives a second pixel emissive area and the second pixel emissive area, wherein the first pixel emissive area and the second pixel emissive area emit similar colors.

4. The apparatus of claim 3, wherein the first pixel emissive area is closer to the high density region than the second pixel emissive area is to the high density region.

5. The apparatus of claim 1, wherein each of the pixel circuits in the low density region has a same distance to the pixel emissive area driven by the pixel circuit in the low density region.

6. The apparatus of claim 1, wherein each of the pixel circuits in the transition region drives two corresponding pixel emissive areas and the density of pixel emissive areas in the transition region is higher than a density of pixel emissive areas in the low density region.

7. The apparatus of claim 1, wherein each of the pixel circuits in the transition region drives a corresponding pixel emissive area and the density of pixel emissive areas in the transition region matches a density of pixel emissive areas in the low density region.

8. The apparatus of claim 1, wherein the low density region is above the sensor and the sensor does not receive electromagnetic radiation transmitted through the transition region.

9. The apparatus of claim 1, wherein the transition region surrounds the low density region.

10. The apparatus of claim 9, wherein the low density region is circular and the transition region is ring-shaped.

11. The apparatus of claim 9, wherein the low density region is circular and the transition region is square with a cut out in a center for the low density region.

12. The apparatus of claim 1, wherein the transition region is curved and a number of corresponding pixel emissive areas that each of the pixel circuits in the transition region drives varies based on locations of the pixel circuits.

13. The apparatus of claim 1, wherein the low density region is 10% or less of a total area of the LED display.

14. The apparatus of claim 1, wherein the transition region is 10% or less of a total area of the LED display.

15. The apparatus of claim 1, wherein the density of pixel emissive areas in the high density region is 400 pixels per inch or more and the density of pixel emissive areas in the transition region is 250 pixels per inch or less.

16. The apparatus of claim 1, wherein the sensor is a camera.

17. The apparatus of claim 1, wherein the apparatus is a smartphone.

18. The apparatus of claim 1, wherein a density of the pixel emissive areas in the transition region is higher than a density of the pixel emissive areas in the low density region.

19. The apparatus of claim 1, wherein the sensor includes a component that emits second electromagnetic radiation transmitted through the low density region.

20. The apparatus of claim 1, wherein the low density region allows emission of second electromagnetic radiation from the sensor.

* * * * *